(12) United States Patent
Lee et al.

(10) Patent No.: US 11,056,645 B2
(45) Date of Patent: Jul. 6, 2021

(54) VERTICAL MEMORY DEVICES

(71) Applicant: Samsung Electronics Co., Ltd., Suwon-si (KR)

(72) Inventors: Kyung-Hwan Lee, Hwaseong-si (KR); Yong-Seok Kim, Suwon-si (KR); Jun-Hee Lim, Seoul (KR); Kohji Kanamori, Seongnam-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/509,836

(22) Filed: Jul. 12, 2019

(65) Prior Publication Data

US 2020/0203430 A1    Jun. 25, 2020

(30) Foreign Application Priority Data

Dec. 20, 2018 (KR) .......................... 10-2018-0166554

(51) Int. Cl.
*H01L 45/00* (2006.01)
*H01L 27/24* (2006.01)

(52) U.S. Cl.
CPC .......... *H01L 45/08* (2013.01); *H01L 27/2454* (2013.01); *H01L 27/2481* (2013.01); *H01L 45/06* (2013.01); *H01L 45/144* (2013.01); *H01L 45/146* (2013.01); *H01L 45/147* (2013.01)

(58) Field of Classification Search
None
See application file for complete search history.

(56) References Cited

U.S. PATENT DOCUMENTS

| | | | |
|---|---|---|---|
| 6,985,378 B2 * | 1/2006 | Kozicki | B82Y 10/00 257/296 |
| 7,786,464 B2 * | 8/2010 | Nirschl | H01L 45/1233 257/3 |
| 8,427,865 B2 | 4/2013 | Shima et al. | |
| 8,692,223 B2 | 4/2014 | Moon et al. | |
| 8,699,262 B2 | 4/2014 | Watanabe et al. | |
| 9,153,624 B2 | 10/2015 | Jo | |
| 9,691,978 B2 | 6/2017 | Toriyama et al. | |
| 9,847,378 B2 | 12/2017 | Sheng et al. | |
| 9,929,213 B2 | 3/2018 | Read et al. | |
| 2010/0108972 A1 | 5/2010 | Zhao et al. | |
| 2013/0048938 A1 * | 2/2013 | Shintani | H01L 45/06 257/4 |
| 2017/0213869 A1 * | 7/2017 | Read | H01L 27/2463 |
| 2017/0309820 A1 * | 10/2017 | Sandhu | H01L 45/08 |
| 2018/0212147 A1 | 7/2018 | Ruiz et al. | |

* cited by examiner

*Primary Examiner* — Steven B Gauthier
(74) *Attorney, Agent, or Firm* — Muir Patent Law, PLLC

(57) ABSTRACT

A vertical memory device includes gate electrodes on a substrate and a first structure. The gate electrodes may be spaced apart from each other in a first direction perpendicular to an upper surface of the substrate. The first structure extends through the gate electrodes in the first direction, and includes a channel and a variable resistance structure sequentially stacked in a horizontal direction parallel to the upper surface of the substrate. The variable resistance structure may include quantum dots (QDs) therein.

20 Claims, 21 Drawing Sheets

VERTICAL MEMORY DEVICES

CROSS-REFERENCE TO RELATED APPLICATIONS

This application claims priority under 35 USC § 119 to Korean Patent Application No. 10-2018-0166554, filed on Dec. 20, 2018 in the Korean Intellectual Property Office (KIPO), the contents of which are herein incorporated by reference in their entirety.

BACKGROUND

1. Field

The inventive concepts relate to a vertical memory device.

2. Description of the Related Art

A VNAND flash memory device including cells stacked in a vertical direction may have a high operation voltage, and as the number of the stacked cells increases and the size of each cell decreases, the interference between the cells may increase. Thus, a VNAND flash memory device having a low operation voltage and a low interference between cells is desirable.

A semiconductor nanocrystal, also known as a quantum dot (QD) is a semiconductor material having a crystalline structure with a size of several nanometers. Nanoparticles have physical characteristics (e.g., energy bandgaps and melting points) that depend on particle size, unlike bulk materials. Quantum dots have such a small size that they have a large surface area per unit volume and exhibit quantum confinement effects, and thus have different physicochemical characteristics from the characteristics of the bulk material. Quantum dots may absorb light from an excitation source and may emit light energy corresponding to an energy bandgap of the quantum dot. In the quantum dots, the energy bandgap may be selected by controlling the sizes and/or the compositions of the nanocrystals.

SUMMARY

Example embodiments provide a vertical memory device having improved characteristics.

Example embodiments employ quantum dots in a vertical memory device to result in these improved characteristics.

According to an aspect of the inventive concept, a vertical memory device includes gate electrodes on a substrate and a first structure. The gate electrodes may be spaced apart from each other in a first direction perpendicular to an upper surface of the substrate. The first structure extends through the gate electrodes in the first direction, and includes a channel and a variable resistance structure sequentially stacked in a horizontal direction parallel to the upper surface of the substrate. The variable resistance structure may include quantum dots (QDs) therein.

According to an aspect of the inventive concept, which may reflect the same or a different embodiment as the previously-described aspect a vertical memory device includes gate electrodes on a substrate and a first structure. The gate electrodes are spaced apart from each other in a first direction perpendicular to an upper surface of the substrate. The first structure extends through the gate electrodes in the first direction, and includes a channel and a variable resistance structure sequentially stacked in a horizontal direction parallel to the upper surface of the substrate. The variable resistance structure may include a plurality of depletion regions spaced apart from each other in the first direction therein.

According to an aspect of the inventive concept, which may reflect the same or a different embodiment as the previously-described aspect, a vertical memory device includes gate electrodes on a substrate and a firs structure. The gate electrodes are spaced apart from each other in a first direction perpendicular to an upper surface of the substrate. The first structure extends through the gate electrodes in the first direction, and includes a gate insulation layer, a current path layer and an information storage layer sequentially stacked in a horizontal direction parallel to the upper surface of the substrate from each of the gate electrodes. The information storage layer may include a quantum dot (QD) therein.

In example embodiments, the vertical memory device may include the variable resistance structure instead of a charge storage structure, and thus may be operated by a relatively low operation voltage. Additionally, the interference between lower and upper cells may be low, and the thickness of the variable resistance structure serving as an information storage structure may be small so that the vertical memory device may have an enhanced integration degree.

Quantum dots may be formed in the variable resistance structure so that filaments may be formed by a relatively low energy, and thus information may be stored with a relatively low operation voltage. Additionally, a plurality of depletion regions may be formed in the variable resistance structure so that the variable resistance structure may have a low resistance distribution.

DETAILED DESCRIPTION

The above and other aspects and features of the vertical memory devices and the methods of manufacturing the same in accordance with example embodiments will become readily understood from detail descriptions that follow, with reference to the accompanying drawings.

Figure 1:
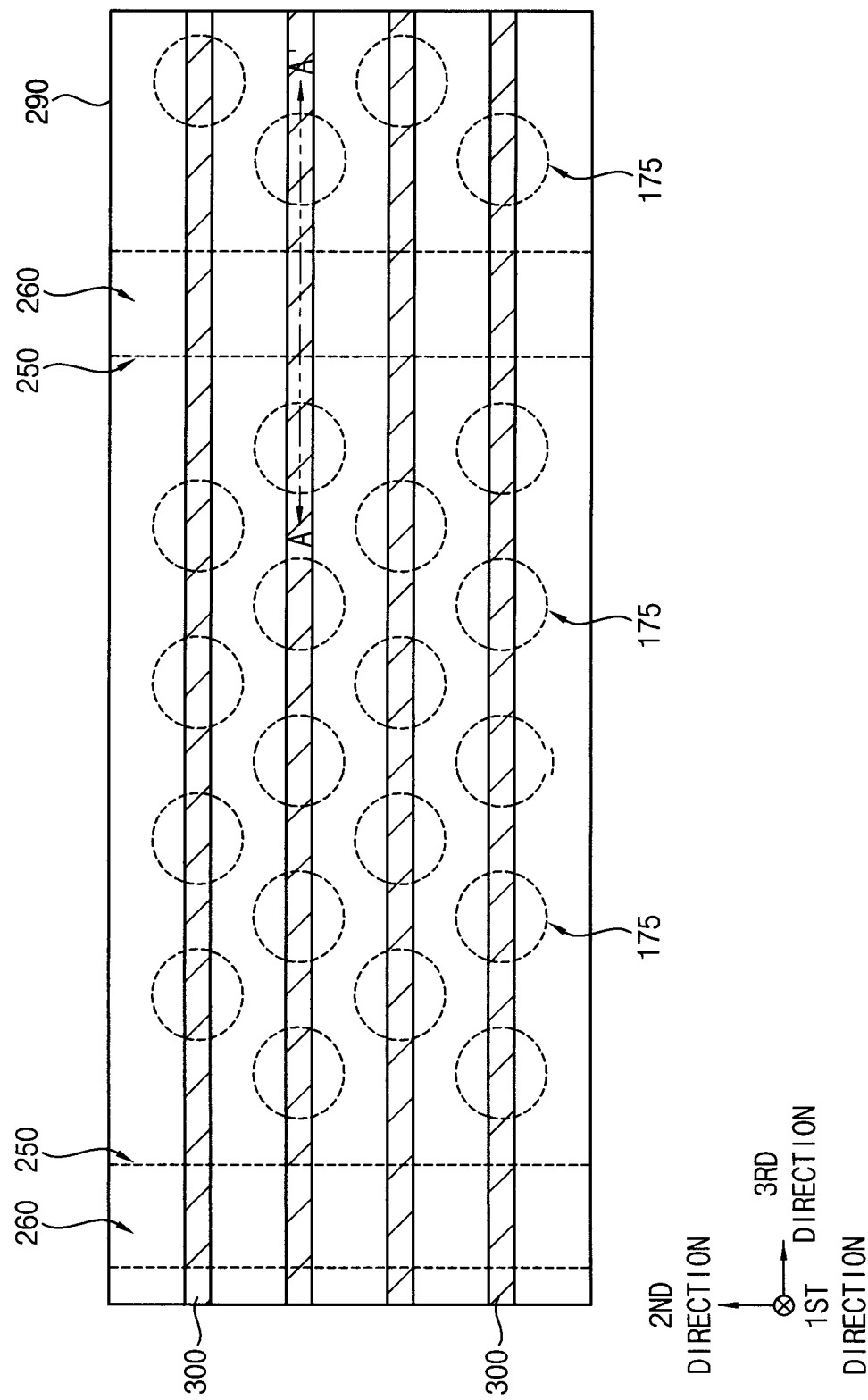
FIGS. 1 to 3 are a plan view and cross-sectional views illustrating a vertical memory device in accordance with example embodiments.
Figure 2:
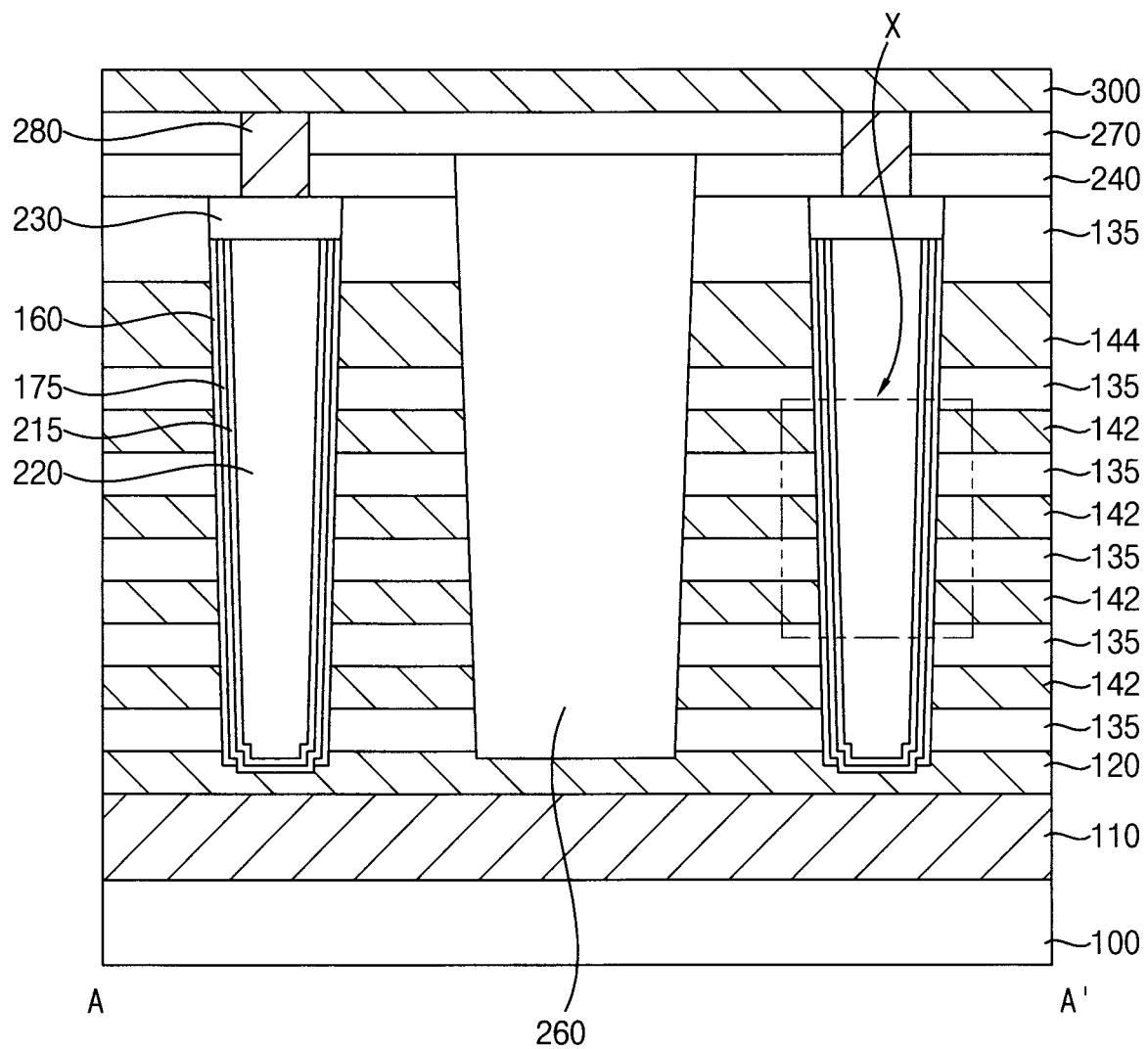
Figure 3:
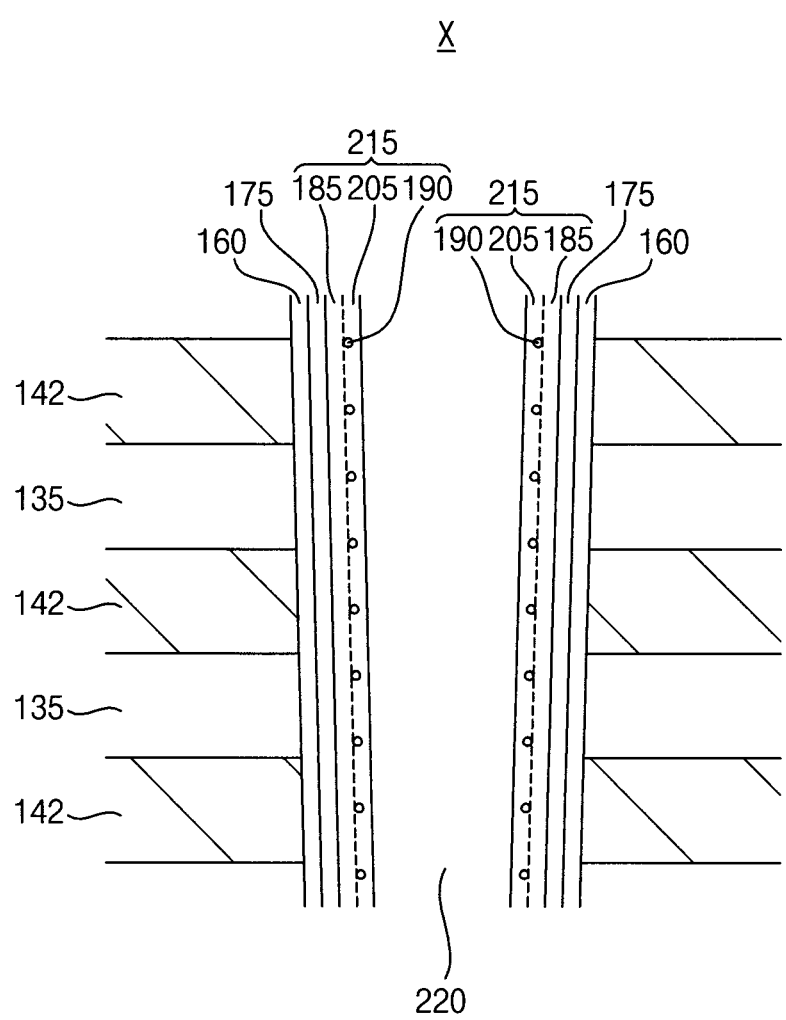

FIGS. 1 to 3 are a plan view and cross-sectional views illustrating a vertical memory device in accordance with example embodiments. Particularly, FIG. 1 is the plan view, FIG. 2 is a cross-sectional view taken along a line A-A' of FIG. 1, and FIG. 3 is an enlarged cross-sectional view of a region X in FIG. 2.

Hereinafter, a direction substantially perpendicular to an upper surface of a substrate may be described as a first direction, which may be described as a vertical direction, and two directions substantially parallel to the upper surface of the substrate and crossing each other may be described as second and third directions, respectively, and may be described as horizontal directions. In example embodiments, the second and third directions may be substantially perpendicular to each other, and may also be substantially perpendicular to the first direction. It should be understood, however, that ordinal numbers such as "first," "second," "third," etc. may be used simply as labels of certain elements, directions, steps, etc., to distinguish such elements, directions steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim set).

Referring to FIGS. 1 to 3, the vertical memory device may include a gate electrode structure, an insulation pattern structure, and a first structure extending through the gate electrode structure and the insulation pattern structure on a substrate 100. The vertical memory device may further include a common source line (CSL) plate 110, an impurity region 120, a pad 230 (e.g., plurality of pads 230), a division layer 260 (e.g., plurality of division layers 260), a contact plug 280 (e.g., plurality of contact plugs 280), a bit line 300 (e.g., plurality of bit lines 300), and first to third insulating interlayers 240, 270 and 290 on the substrate 100. Items shown in plural in the figures may be described herein with reference to only one of the items, which may have the same structure and function as the remaining plurality of the items.

The substrate 100 may be or include silicon, germanium, silicon-germanium or a III-V compound such as GaP, GaAs, GaSb, etc. In some embodiments, the substrate 100 may be a silicon-on-insulator (SOI) substrate or a germanium-on-insulator (GOI) substrate.

The CSL plate 110 and the impurity region 120 may be sequentially stacked on the substrate 100.

In example embodiments, the CSL plate 110 may be a conductive material, such as a metal, e.g., tungsten, or a metal silicide, e.g., tungsten silicide. The impurity region 120 may be a conductive material, e.g., polysilicon doped with n-type impurities.

The gate electrode structure may include a plurality of gate electrodes at a plurality of levels, respectively, spaced apart from each other in the first direction. The gate electrode structure may extend lengthwise in the second direction, and a plurality of gate electrode structures may be formed in the third direction. An item, layer, or portion of an item or layer described as extending "lengthwise" in a particular direction has a length in the particular direction and a width perpendicular to that direction, where the length is greater than the width. For example, the gate electrode structures each of which may extend in the second direction at the same level may be spaced apart from each other, in the third direction by an opening 250.

In example embodiments, the division layer 260 may extend lengthwise in the second direction in the opening 250. The division layer 260 may be an insulation layer formed of an insulative material, and may be or include an oxide, e.g., silicon oxide.

Each of the gate electrode structures may include a plurality of first gate electrodes 142 sequentially stacked in the first direction and at least one second gate electrode 144.

In example embodiments, each of the first gate electrodes 142 may serve as a word line, and the second gate electrode 144 may serve as a string selection line (SSL).

FIG. 2 shows that the first gate electrode 142 is formed at four levels (e.g., vertical levels), and the second gate electrode 144 is formed at one level, however, the inventive concepts are not limited thereto, and the second gate electrode 144 may be also formed at a plurality of levels. In some embodiments, certain ones of the first gate electrodes 142 may be used as dummy word lines.

Each of the first and second gate electrodes 142 and 144 may be or include a conductive material, e.g., polysilicon doped with n-type impurities. In an example embodiment, a thickness of the second gate electrode 144 in the first direction may be greater than those of the first gate electrodes 142 in the first direction.

The insulation pattern structure may include a plurality of insulation patterns 135 sequentially stacked in the first direction. The insulation patterns 135 may be respectively formed between the impurity region 120 and the first gate electrode 142, between neighboring ones of the first and second gate electrodes 142 and 144 in the first direction, and on the second gate electrode 144.

In example embodiments, at a particular level in the first direction (e.g., vertical level), each insulation pattern 135 extends lengthwise in the second direction, and a plurality of insulation patterns 135 are formed in the third direction to be spaced apart from each other by openings 250. The insulation patterns 135 may be or include an insulative material, such as an oxide, e.g., silicon oxide.

The first structure may extend in the first direction from an upper surface of the impurity region 120 through the gate electrode structure and the insulation pattern structure, and may include a channel 175 (e.g., a plurality of channels) and a variable resistance structure 215 (e.g., a plurality of variable resistance structures) sequentially stacked in a horizontal direction substantially parallel to the upper surface of the substrate 100, a gate insulation pattern 160 covering an outer sidewall and an edge lower surface of the channel 175, and a filling pattern 220 filling an inner space formed by an inner wall of the variable resistance structure 215. The first structure may be provided in plural, such that a plurality of first structures are formed, each including a channel 175, a variable resistance structure 215, a gate insulation pattern 160, and a filling pattern 220.

In example embodiments, each of the channel 175 and the variable resistance structure 215 may have a cup-like shape, and a bottom of the channel 175 may contact the upper surface of the impurity region 120. The term "contact" as used herein refers to a direct connection, i.e., touching. The gate insulation pattern 160 may have a hollow cylindrical shape, and the filling pattern 220 may have a pillar shape. Thus, the first structure may have a pillar shape extending in the first direction.

The gate insulation pattern 160 may be or include an oxide, e.g., silicon oxide.

The channel 175 may be or include crystalline silicon, e.g., polysilicon or single crystalline silicon, and the filling pattern 220 may be or include an oxide, e.g., silicon oxide. In example embodiments, a plurality of channels 175 may be formed in each of the second and third directions, and thus a channel array may be defined.

The variable resistance structure 215 may include first and second variable resistance patterns 185 and 205 sequentially stacked and a first quantum dot (QD) 190 therein (e.g., a plurality of first quantum dots (QD) 190).

In example embodiments, the first and second variable resistance patterns 185 and 205 may include a material of which an electrical resistance may vary according to oxygen vacancy or oxygen movement.

For example, each of the first and second variable resistance patterns 185 and 205 may be or include a perovskite-based material or a transition metal oxide. The perovskite-based material may include, e.g., STO ($SrTiO_3$), BTO ($BaTiO_3$), PCMO ($Pr_{1-x}Ca_xMnO_3$), or the like. The transition metal oxide may be or include titanium oxide (TiOx), zirconium oxide (ZrOx), aluminum oxide (AlOx), hafnium oxide (HfOx), tantalum oxide (TaOx), niobium oxide (NbOx), cobalt oxide (CoOx), tungsten oxide (WOx), lanthanum oxide (LaOx), zinc oxide (ZnOx), etc. These may be used alone or in combination.

Alternatively, each of the first and second variable resistance patterns 185 and 205 may include a material of which an electrical resistance may vary according to phase change thereof. For example, each of the first and second variable resistance patterns 185 and 205 may be or include a chalcogenide material containing germanium, antimony and/or tellurium.

In some embodiments, the first and second variable resistance patterns 185 and 205 may include substantially the same material, and thus may be merged with each other. For example, they may form an integral pattern with no grain boundary therebetween.

In example embodiments, a plurality of first QDs 190 may be formed to be spaced apart from each other in the first direction in the variable resistance structure 215. Some of the first QDs 190 may contact each other.

In an example embodiment, the first QD 190 may be formed in the second variable resistance pattern 205, and QDs 190 formed in the second variable resistance pattern 205 may be formed at an interface between the second variable resistance pattern 205 and the first variable resistance pattern 185, and may contact a surface of the first variable resistance pattern 185.

In example embodiments, the first QD 190 may be or include a metal, a metal silicide, or a semiconductor material. The metal may include, e.g., platinum, tungsten, nickel, etc., the metal silicide may include, e.g., tungsten silicide, and the semiconductor material may include, e.g., silicon, germanium, silicon-germanium, or carbon.

The pad 230 may be formed on the first structure, and may extend partially through an uppermost one of the insulation patterns 135. The pad 230 may be or include, e.g., crystalline silicon doped with impurities.

The contact plug 280 may be formed on the pad 230, and the bit line 300 may be formed on the contact plug 280. The contact plug 280 may extend through the first and second insulating interlayers 240 and 270 to contact an upper surface of the pad 230, and the bit line 300 may extend through the third insulating interlayer 290 to contact an upper surface of the contact plug 280.

The contact plug 280 and the bit line 300 may be or include a metal, e.g., copper, aluminum, tungsten, titanium, tantalum, etc., and/or a metal nitride, e.g., titanium nitride, tantalum nitride, tungsten nitride, etc., and the first to third insulating interlayers 240, 270 and 290 may be or include an oxide, e.g., silicon oxide.

The vertical memory device may include the variable resistance structure 215 having the variable resistance patterns 185 and 205 instead of a charge storage structure having, e.g., a tunnel insulation pattern, a charge storage pattern and a blocking pattern. Thus, the erase operation may not need to be performed on the whole cells including a plurality of gate electrodes disposed in the first direction, but may be performed on each cell including the gate electrode at each level, so that a high operation voltage may not be needed. Additionally, the vertical memory device may not be a memory device based on charges, but may be a memory device based on currents, so that the interference between upper and lower cells therein may be low.

A thickness of the variable resistance structure 215 serving as an information storage element may be less than that of the charge storage structure, and thus the vertical memory device may have a small area. The variable resistance structure 215 may be referred to as an information storage structure, information storage layer, or variable resistance layer, and the first and second variable resistance patterns 185 and 205 may be referred to as first and second information storage structures or layers, or first and second variable resistance layers, respectively. The channel 175 may be referred to as a current path pattern or current path layer.

Hereinafter, the difference between the variable resistance structure 215 including the first QDs 190 in accordance with example embodiments and a variable resistance structure including no QD in a comparative embodiment will be explained in detail.

Figure 4A:
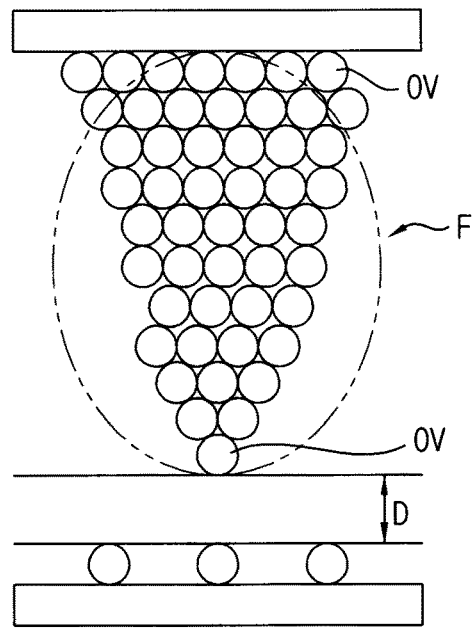
FIGS. 4A and 4B illustrate filament formation energy and resistance distribution of variable resistance structures in accordance with a comparative embodiment and example embodiments, respectively.
Figure 4B:
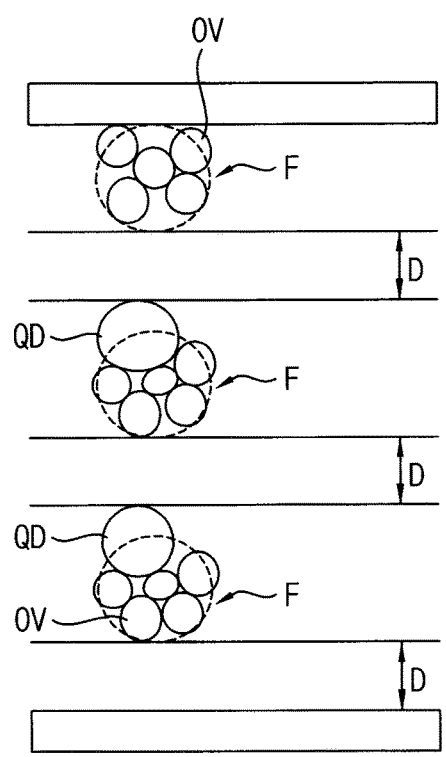

FIGS. 4A and 4B illustrate filament formation energy and resistance distribution of variable resistance structures in accordance with a comparative embodiment and example embodiments, respectively.

Referring to FIG. 4A, oxygen vacancies (OV) are stacked in a given region of the variable resistance structure, and one depletion region (D) is formed therebetween. When an operation voltage above a given value is applied to the given region, filaments (F) may be formed in the given region at which no depletion region (D) is formed.

Referring to FIG. 4B, quantum dots (QD) may be disposed in a given region of the variable resistance structure, for example, to be arranged adjacent to each other in the first (e.g., vertical) direction with spaces therebetween, and thus a plurality of depletion regions (D) may be formed to be spaced apart from each other (e.g., in the first direction) in the given region (for example, between neighboring ones of the second gate electrodes 142 that are turned on). When an operation voltage above a given value is applied to the given region, filaments (F) may be formed in the given region between the depletion regions (D). As the plurality of depletion regions (D) is formed in the given region, a plurality of filaments (F) may be formed, and each of the filaments (F) may have a length less than that of the filament (F) of FIG. 4A, so that filament formation energy thereof may be low.

Accordingly, the filament may be formed in the variable resistance structure of FIG. 4B with an energy less than that of the variable resistance structure of FIG. 4A, and thus information may be stored by a relatively low operation voltage.

Only one depletion region (D) having a relatively high resistance is formed in the variable resistance structure of FIG. 4A and a length of other regions therein is relatively long, and thus the resistance distribution may be great according to the distribution of oxygen vacancies (OV) in the other regions. However, a plurality of depletion regions (D) each having a relatively high resistance may be formed in the variable resistance structure of FIG. 4B and a length of other regions therein is relatively short, and thus the resistance distribution may be small according to the distribution of oxygen vacancies (OV) in the other regions.

Figure 5:
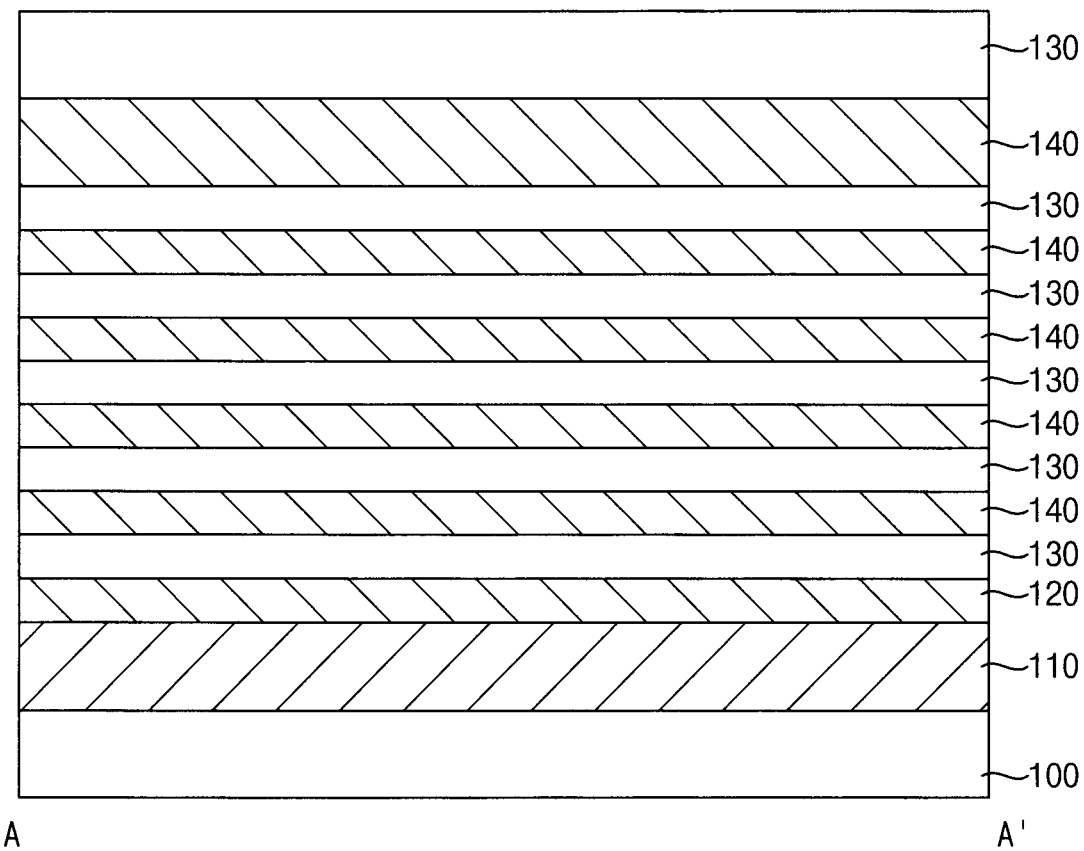
FIGS. 5 to 14 are plan views and cross-sectional views illustrating a method of manufacturing a vertical memory device in accordance with example embodiments.
Figure 6:
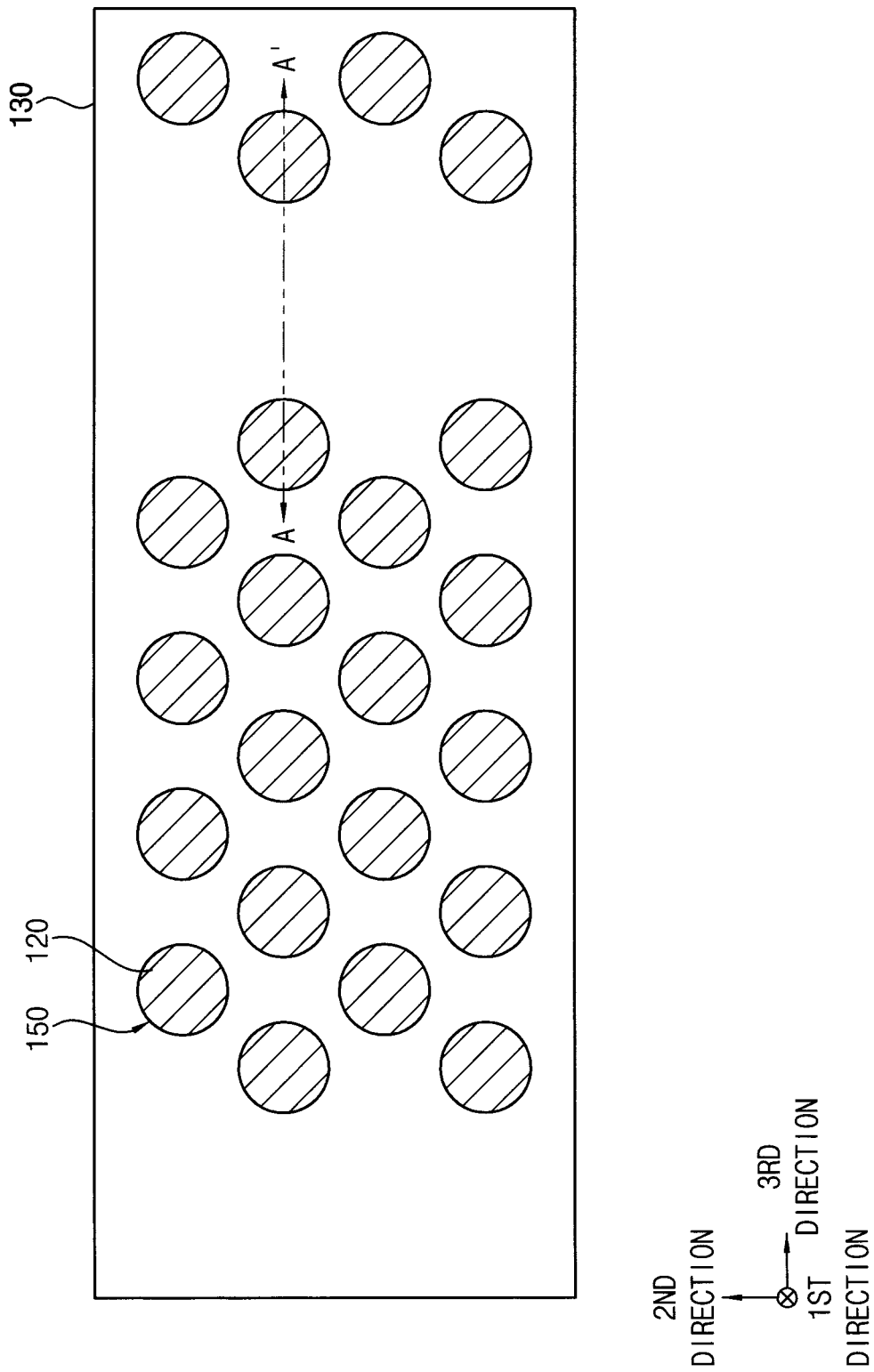
Figure 8:
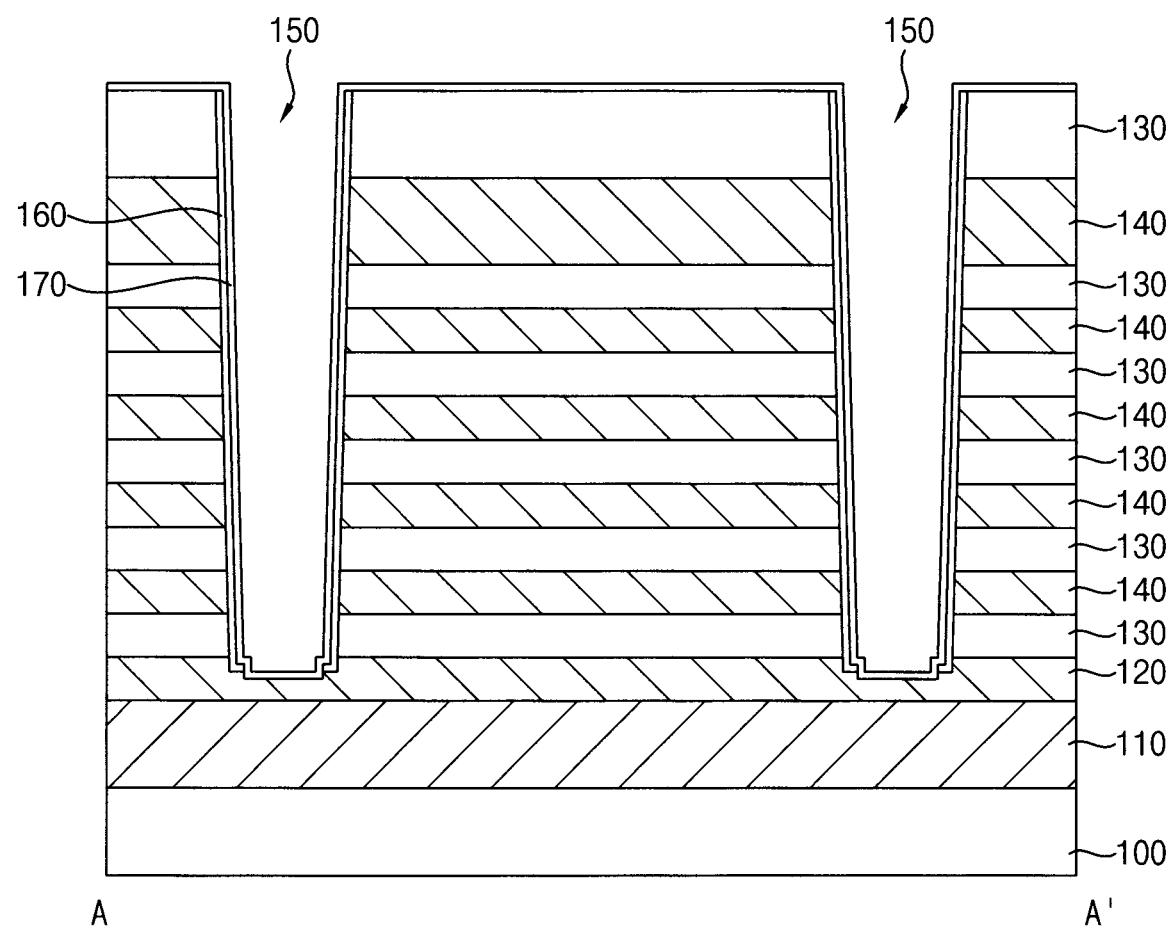
Figure 9:
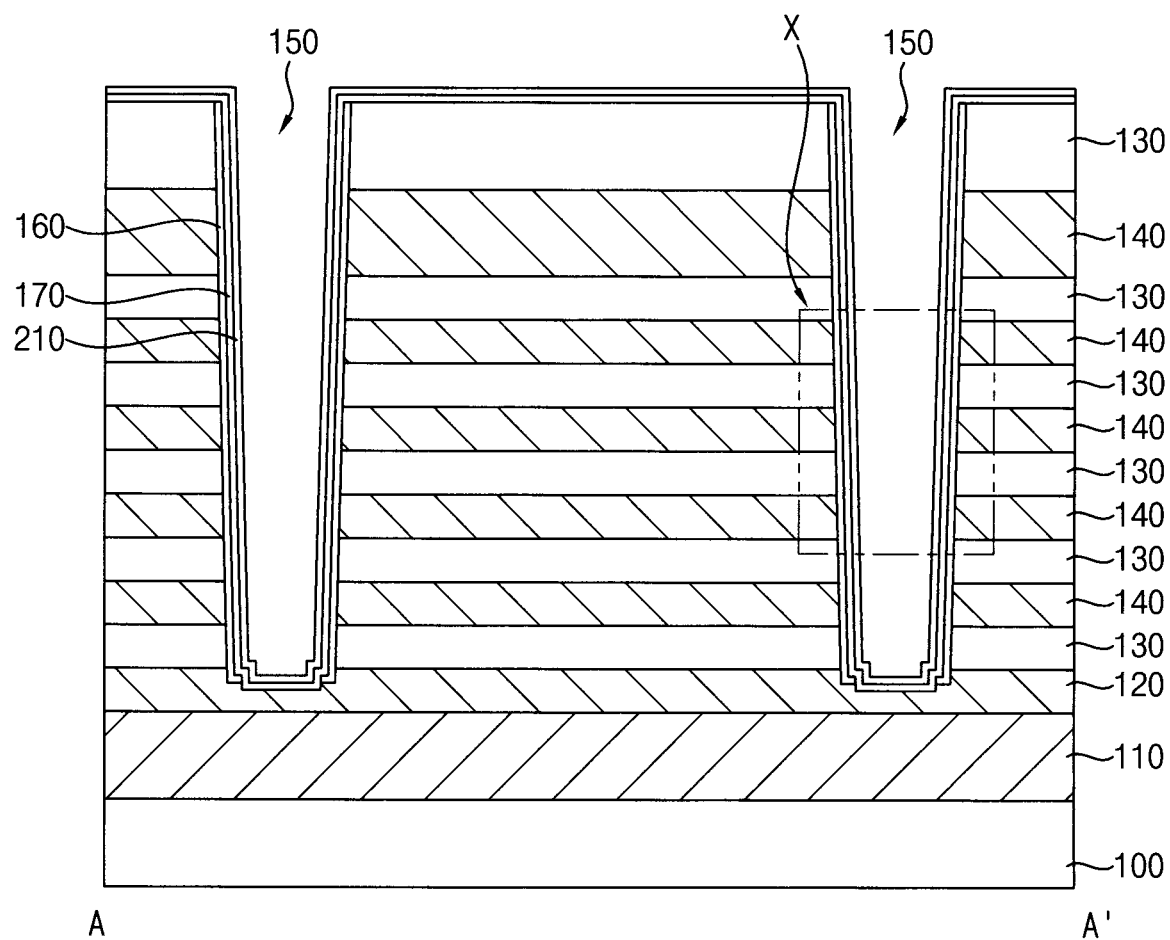
Figure 9:
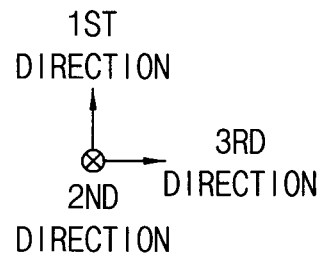
Figure 10:
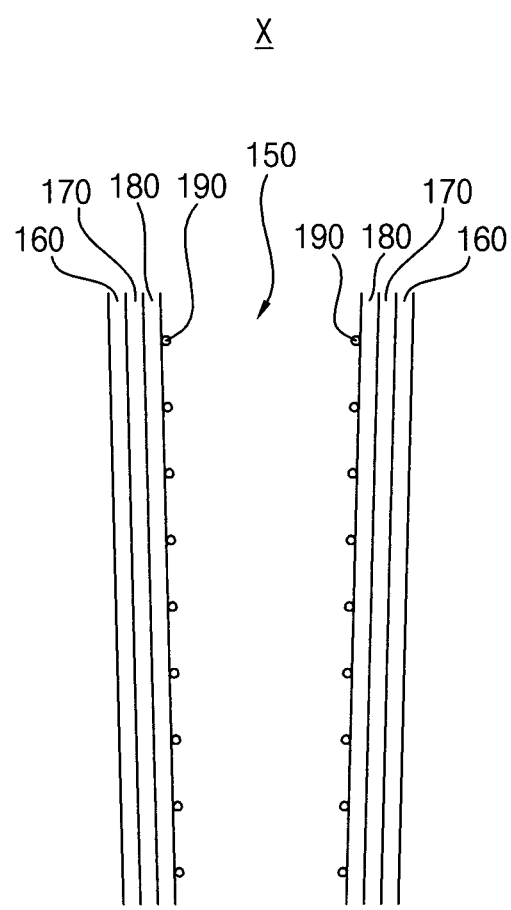
Figure 11:
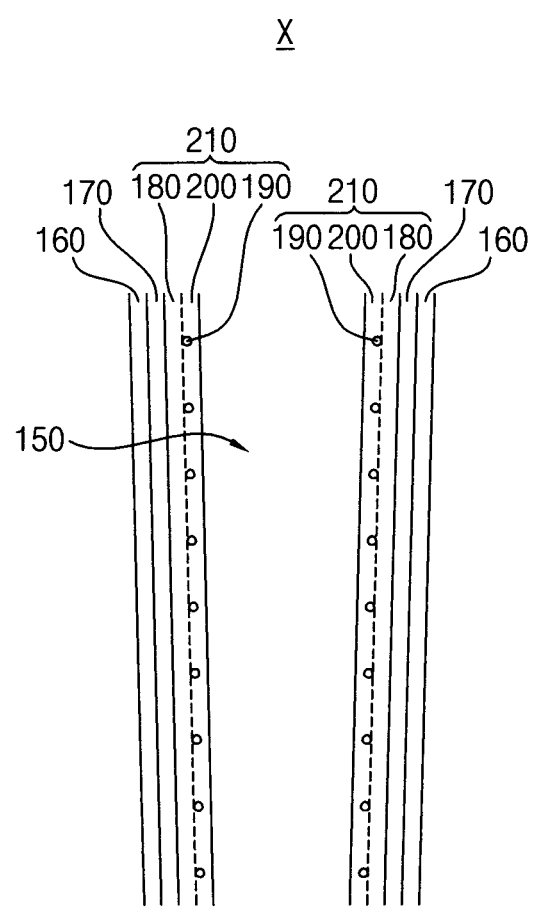
Figure 12:
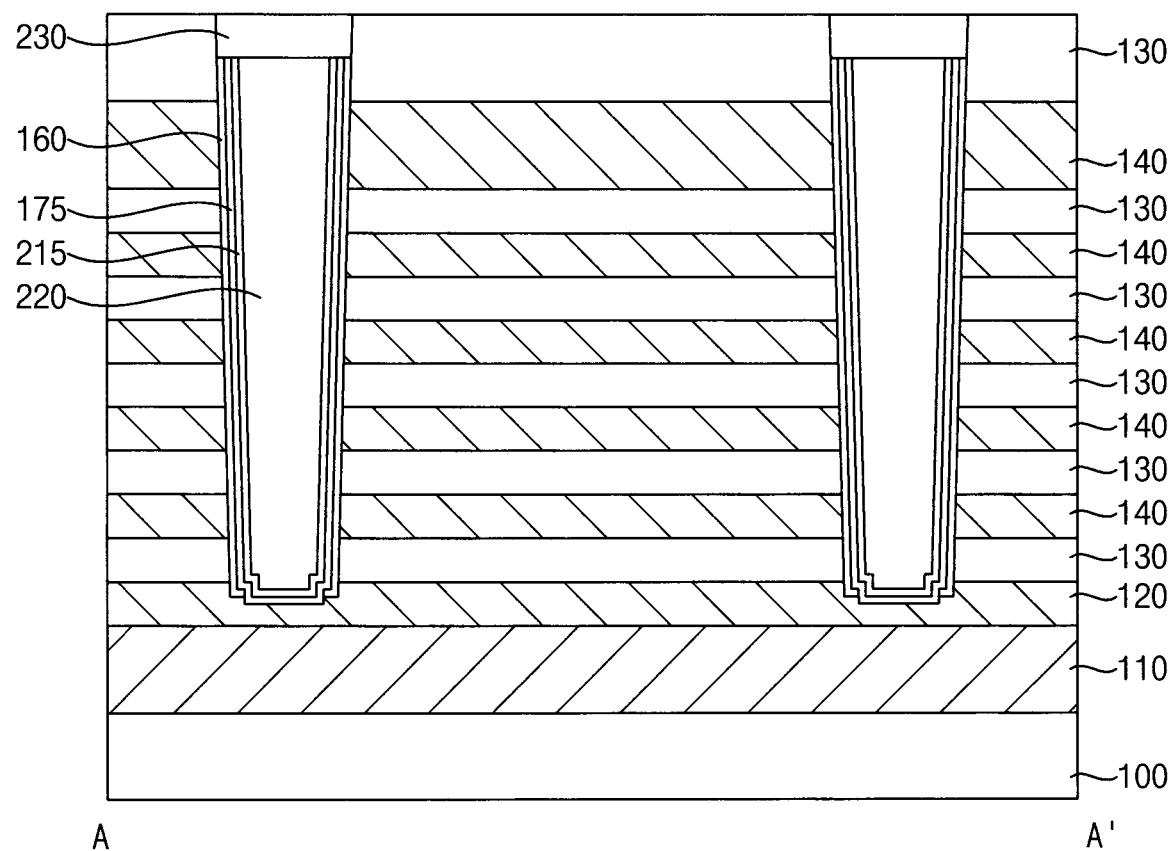
Figure 13:
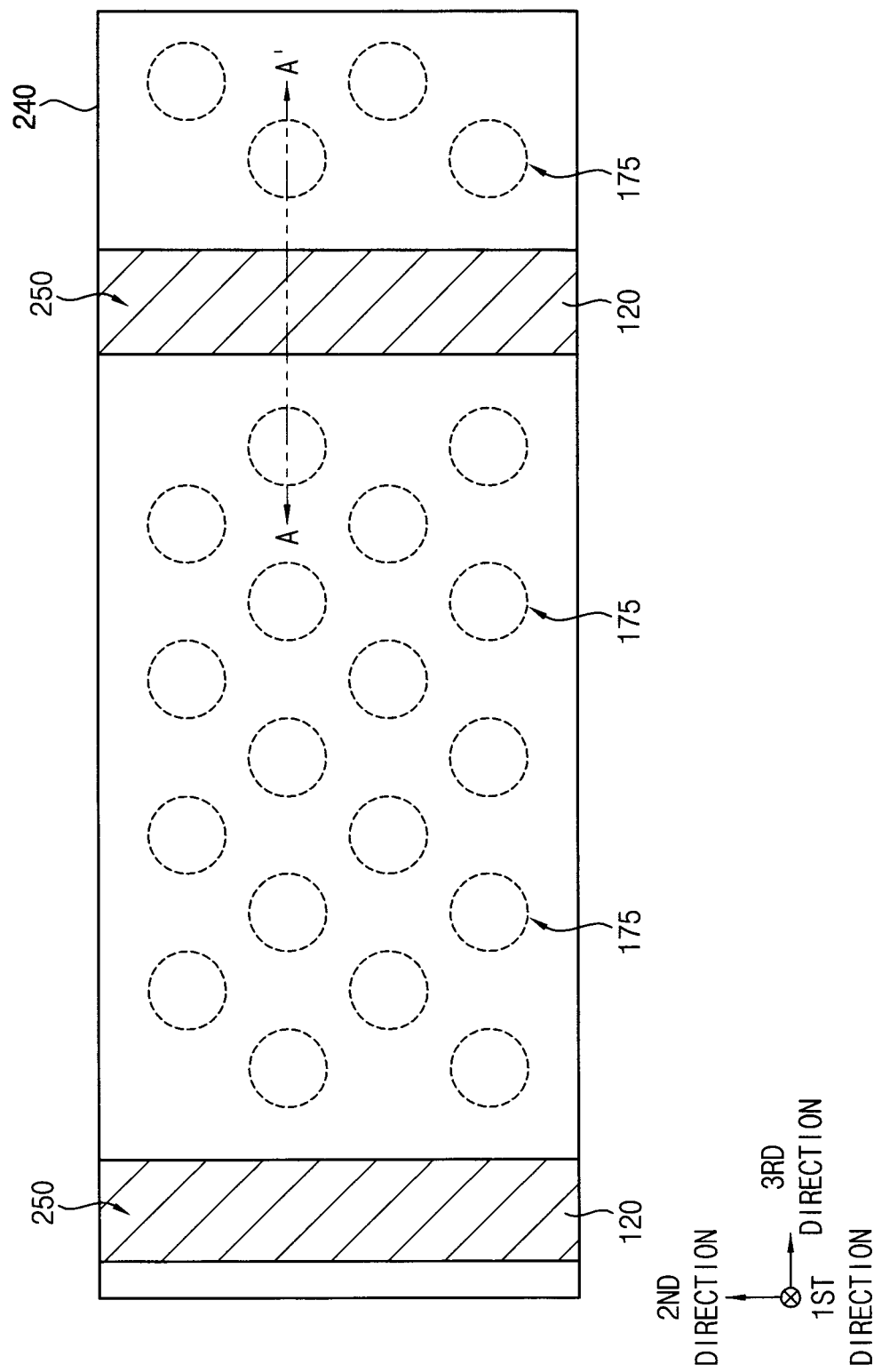

FIGS. 5 to 14 are plan views and cross-sectional views illustrating a method of manufacturing a vertical memory device in accordance with example embodiments. Particularly, FIGS. 6 and 13 are the plan views, and FIGS. 5, 7-12 and 14 are cross-sectional views taken along lines A-A', respectively, of corresponding plan views. FIGS. 10 and 11 are enlarged cross-sectional views of a region X in FIG. 9.

Referring to FIG. 5, a CSL plate 110, also referred to as a CSL line or CSL layer, and an impurity region 120, also referred to as an impurity layer, are sequentially stacked to be formed on a substrate 100, and an insulation layer 130 and a gate electrode layer 140 may be alternately and repeatedly formed on the impurity region 120 in the first direction.

The insulation layer 130 and the gate electrode layer 140 may be formed by, e.g., a chemical vapor deposition (CVD) process, a plasma enhanced chemical vapor deposition (PECVD) process, an atomic layer deposition (ALD) process, etc. The insulation layer 130 may be or include an oxide, e.g., silicon oxide, and the gate electrode layer 140 may be or include, e.g., polysilicon doped with n-type impurities.

FIG. 5 shows that the insulation layer 130 and the gate electrode layer 140 are stacked at six levels and five levels, respectively, however, the invention is not limited thereto. An uppermost one of the gate electrode layers 140 may have a thickness greater than those of other ones of the gate electrode layers 140, and an uppermost one of the insulation layers 130 may have a thickness greater than those of other ones of the insulation layers 130.

Figure 7:
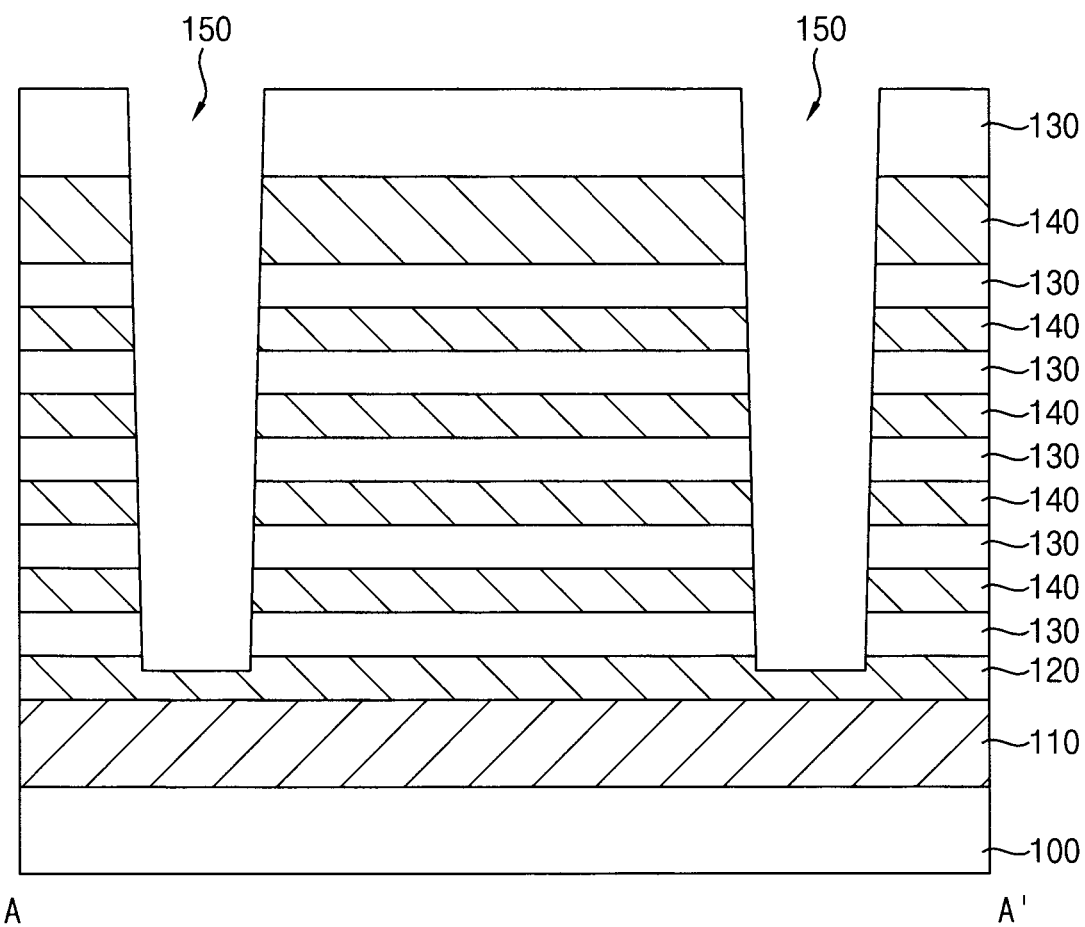
Figure 7:
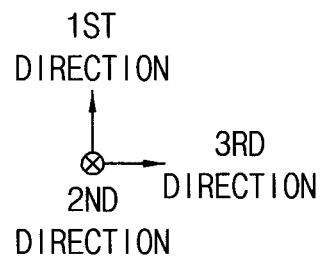

Referring to FIGS. 6 and 7, a channel hole 150 may be formed through the insulation layers 130 and the gate electrode layers 140 to expose the impurity region 120.

Particularly, a photoresist pattern (not shown) may be formed on the uppermost one of the insulation layers 130, and the insulation layers 130 and the gate electrode layers 140 may be etched using the photoresist pattern as an etching mask to form the channel hole 150 exposing an upper surface of the impurity region 120. In some embodiments, a portion of the impurity region 120 may also be etched during this process. In example embodiments, a plurality of channel holes 150 may be formed in each of the second and third directions to form a channel array.

Referring to FIG. 8, a gate insulation pattern 160 may be formed on a sidewall of the channel hole 150 and a portion of the exposed upper surface of the impurity region 120.

Particularly, a gate insulation layer and a spacer layer (not shown) may be sequentially and conformally formed on the sidewall of the channel hole 150, the exposed upper surface of the impurity region 120, and an upper surface of the uppermost one of the insulation layers 130. The spacer layer may be anisotropically etched to form a spacer (not shown) on the sidewall of the channel hole 150, and the gate insulation layer may be etched using the spacer as an etching mask to form the gate insulation pattern 160, also generally described as a gate insulation layer, having a cup-like shape of which a bottom is opened, on the sidewall of the channel hole 150 and an edge of the exposed upper surface of the impurity region 120. During the etching process, an exposed upper portion of the impurity region 120 may be also partially removed.

The gate insulation pattern 160 may be or include an oxide, e.g., silicon oxide, and the spacer may be or include a nitride, e.g., silicon nitride.

After removing the spacer, a channel layer 170 may be formed on the exposed upper surface of the impurity region 120, the gate insulation pattern 160 and the uppermost one of the insulation layers 130.

The channel layer 170 may be or include crystalline silicon, e.g., polysilicon or single crystalline silicon, or amorphous silicon. When the channel layer 170 includes amorphous silicon, amorphous silicon may be converted into crystalline silicon by heat generated from formation processes of other layers. Alternatively, a laser epitaxial growth (LEG) process or a solid phase epitaxy (SPE) process may be further performed so that amorphous silicon may be converted into crystalline silicon.

Referring to FIG. 9, a variable resistance structure layer 210 is formed on the channel layer 170.

A specific method for forming the variable resistance structure layer 210 will be illustrated with reference to FIGS. 10 and 11, which are enlarged cross-sectional views of a region X in FIG. 9.

Referring to FIG. 10, a first variable resistance layer 180 may be formed on the channel layer 170, and first quantum dots (QD) 190 may be formed on the first variable resistance layer 180.

In example embodiments, the first variable resistance layer 180 may be or include a material of which an electrical resistance may vary according to oxygen vacancy or oxygen movement. Alternatively, the first variable resistance layer 180 may include a material of which an electrical resistance may vary according to phase change thereof.

The first QDs 190 may be formed by forming a first QD formation layer on the first variable resistance layer 180 and annealing the first QD formation layer. According to the thickness of the first QD formation layer and the temperature of the annealing, the size of the first QD 190s may be changed. In an example embodiment, as the thickness of the first QD formation layer increases, the size of the first QDs 190 increase.

In example embodiments, a plurality of first QDs 190 may be formed (e.g., arranged) in the first direction with respect to each other, and the plurality of first QDs 190 may be spaced apart from each other or some of the plurality of first QDs 190 may contact each other. Some of the QDs may also be arranged in the horizontal direction with respect to each other.

Referring to FIG. 11, a second variable resistance layer 200 is formed on the first variable resistance layer 180 to cover the first QDs 190.

In example embodiments, the second variable resistance layer 200 may be or include a material substantially the same as that of the first variable resistance layer 180, and thus may be merged thereto. In some embodiments, at an interface between the first variable resistance layer 180 and the second variable resistance layer 200, there is no noticeable surface, and so the combined layers are continuous.

Hereinafter, the first and second variable resistance layers 180 and 200 sequentially stacked in a horizontal direction substantially parallel to an upper surface of the substrate 100, and the first QDs 190 included therein altogether may be referred to as the variable resistance structure layer 210, or more generally, a variable resistance structure or variable resistance layer. The variable resistance structure or variable resistance layer may be described as having a first layer portion (e.g., from the first variable resistance layer 180) and a second layer portion (e.g., from the second variable resistance layer 200 and first QDs 190 therein). The first layer portion may be horizontally adjacent to the second layer portion, and one of the layer portions may include quantum dots, while the other layer portion does not have any quantum dots.

Referring to FIG. 12, a filling layer may be formed on the variable resistance structure layer 210 to fill a remaining portion of the channel hole 150, and the filling layer, the variable resistance structure layer 210 and the channel layer 170 may be planarized until the upper surface of the uppermost one of the insulation layers 130 is exposed to form a filling pattern 220 filling the remaining portion of the channel hole 150. After the planarization, the portions remaining from the variable resistance structure layer 210 and the channel layer 170 may be formed, and may be described as a variable resistance structure 215 and a channel 175, respectively.

Thus, a first structure including the gate insulation pattern 160, the channel 175, the variable resistance structure 215 and the filling pattern 220 sequentially stacked on the impurity region 120 in the channel hole 150 may be formed, and the variable resistance structure 215 may include first and second variable resistance patterns 185 and 205 (refer to FIG. 3) sequentially stacked and the first QD 190 therein.

In example embodiments, each of the channel 175 and the variable resistance structure 215 may have a cup-like shape, and the gate insulation pattern 160 may cover an outer sidewall and an edge lower surface of the channel 175. The filling pattern 220 may have a pillar shape filling an inner space formed by an inner wall of the variable resistance structure 215.

An upper portion of the first structure may be removed to form a trench, and a pad 230 may be formed to fill the trench.

In example embodiments, the pad 230 may be or include crystalline silicon doped with impurities, e.g., polysilicon or single crystalline silicon doped with impurities, or amorphous silicon doped with impurities. When the pad 230 includes amorphous silicon doped with impurities, a crystallization process may be further performed thereon.

Figure 14:
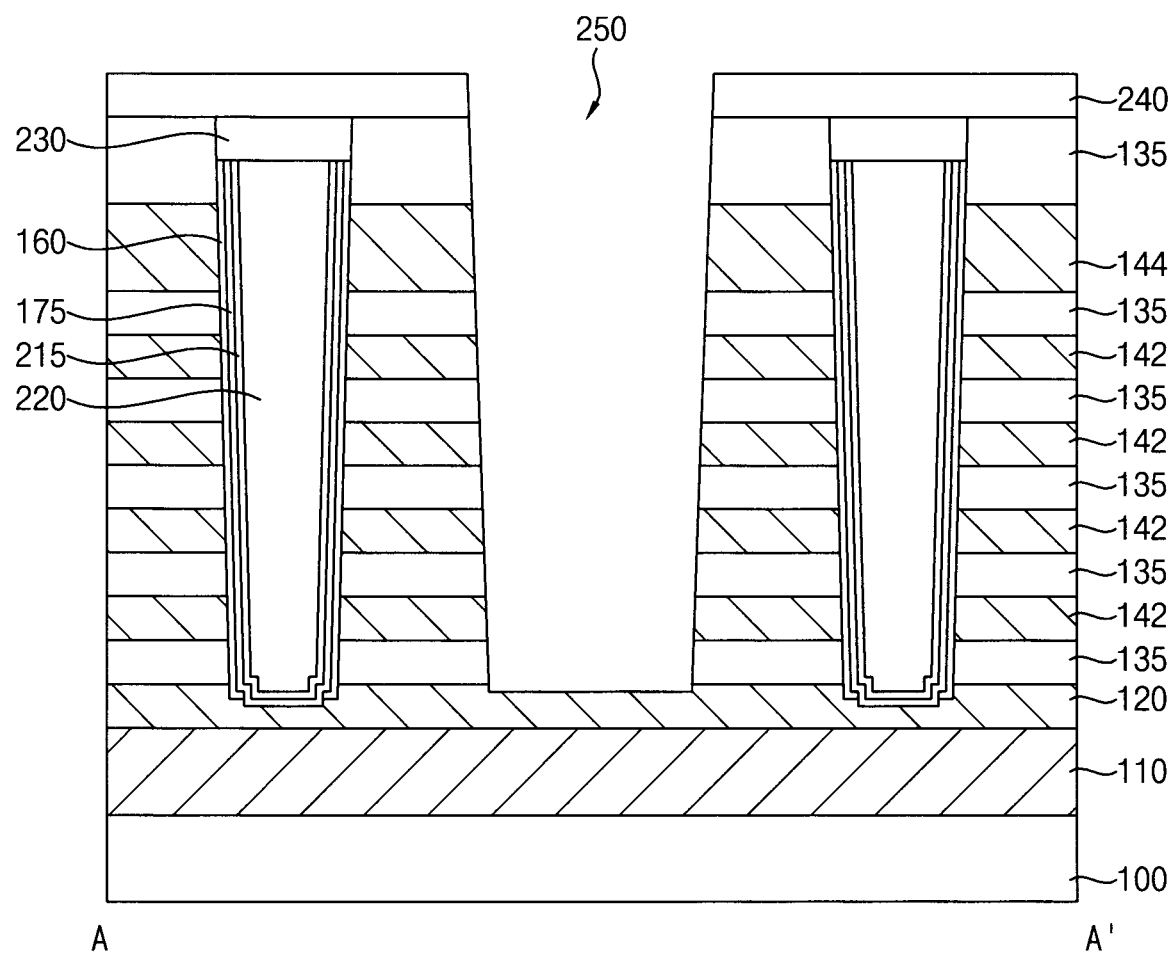

Referring to FIGS. 13 and 14, a first insulating interlayer 240 is formed on the uppermost one of the insulation layers 130 and the pad 230, and an opening 250 is formed through the first insulating interlayers 240, the insulation layers 130 and the gate electrode layers 140 to expose an upper surface of the impurity region 120.

In example embodiments, the opening 250 may extend lengthwise in the second direction, and a plurality of openings 250 may be formed to be arranged in the third direction.

As the opening 250 is formed, the insulation layer 130 becomes an insulation pattern 135 (e.g., a plurality of insulation patterns 135) extending lengthwise in the second direction, and the gate electrode layer 140 may become a gate electrode (e.g., a plurality of gate electrodes) extending lengthwise in the second direction.

The gate electrode may extend in the second direction, and a plurality of gate electrodes may be formed (e.g., arranged) in the third direction at the same level. Therefore, the plurality of gate electrodes each of which may extend lengthwise in the second direction may be spaced apart from each other in the third direction by the opening 250.

In example embodiments, the gate electrodes may be formed at a plurality of levels spaced apart from each other in the first direction, and the stacked gate electrodes at the respective levels may form a gate electrode structure. A plurality of gate electrode structures may be formed to be spaced apart from each other in the third direction. Each gate electrode structure may include a plurality of first gate electrodes 142 and at least one second gate electrode 144.

FIG. 14 shows that the first gate electrode 142 is formed at four levels and the second gate electrode 144 is formed at one level, however, the invention is not limited thereto.

In example embodiments, the first gate electrodes 142 serve as word lines, and the second gate electrode serve as an SSL. Ones of the first gate electrodes 142 may be used as dummy word lines.

Referring to FIGS. 1 to 3 again, a division layer 260 may be formed to fill the opening 250, a second insulating interlayer 270 may be formed on the first insulating interlayer 240 and the division layer 260, and a contact plug 280 may be formed through the first and second insulating interlayers 240 and 270 to contact an upper surface of the pad 230. The division layer 260 may also be described as a separation layer, or isolation layer.

A third insulating interlayer 290 may be formed on the second insulating interlayer 270 and the contact plug 280, and a bit line 300 may be formed through the third insulating interlayer 290 to contact an upper surface of the contact plug 280.

In example embodiments, the bit line 300 extends lengthwise in the third direction, and a plurality of bit lines 300 may be formed (e.g., arranged) in the second direction.

The vertical memory device may be fabricated by the above processes. The vertical memory device may be, for example, a semiconductor chip including an integrated circuit formed on a die.

Figure 15:
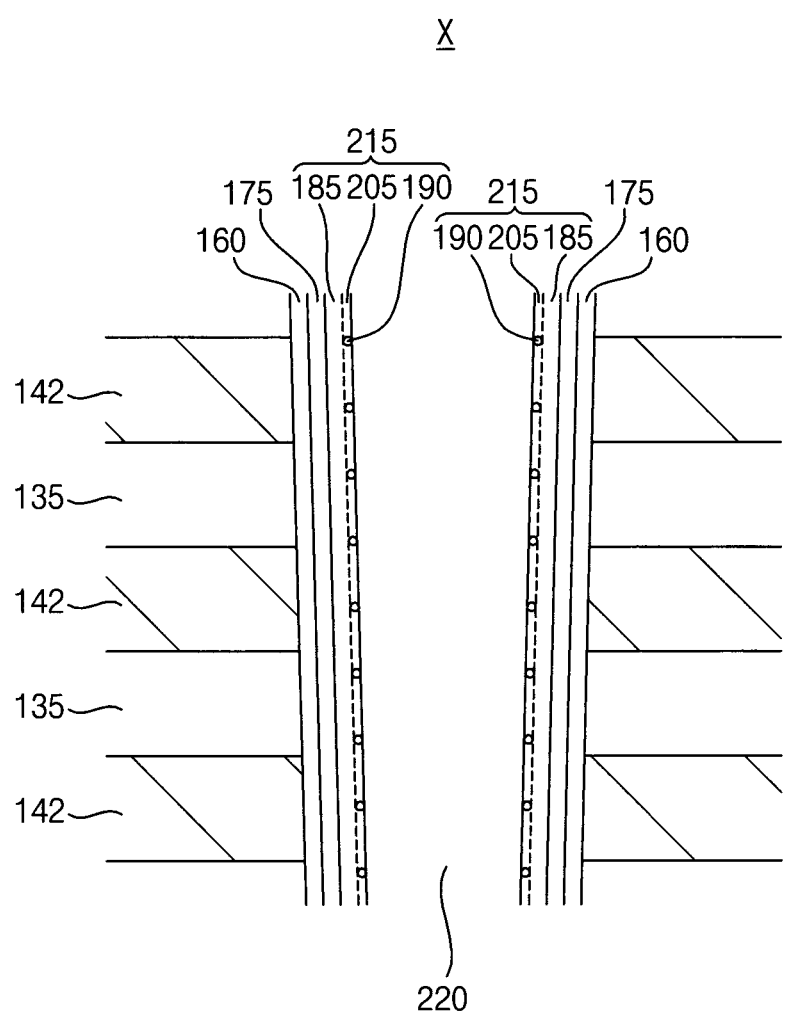
FIGS. 15 to 17 are cross-sectional views illustrating variable resistance structures of a vertical memory device in accordance with example embodiments.
Figure 16:
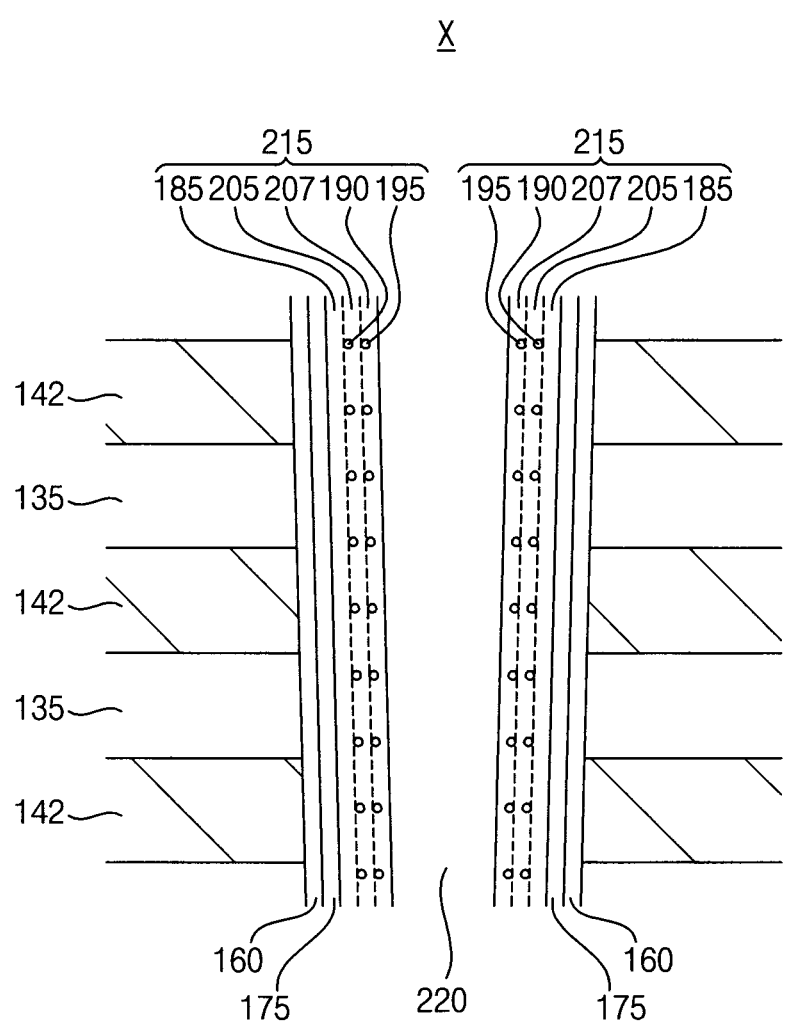
Figure 17:
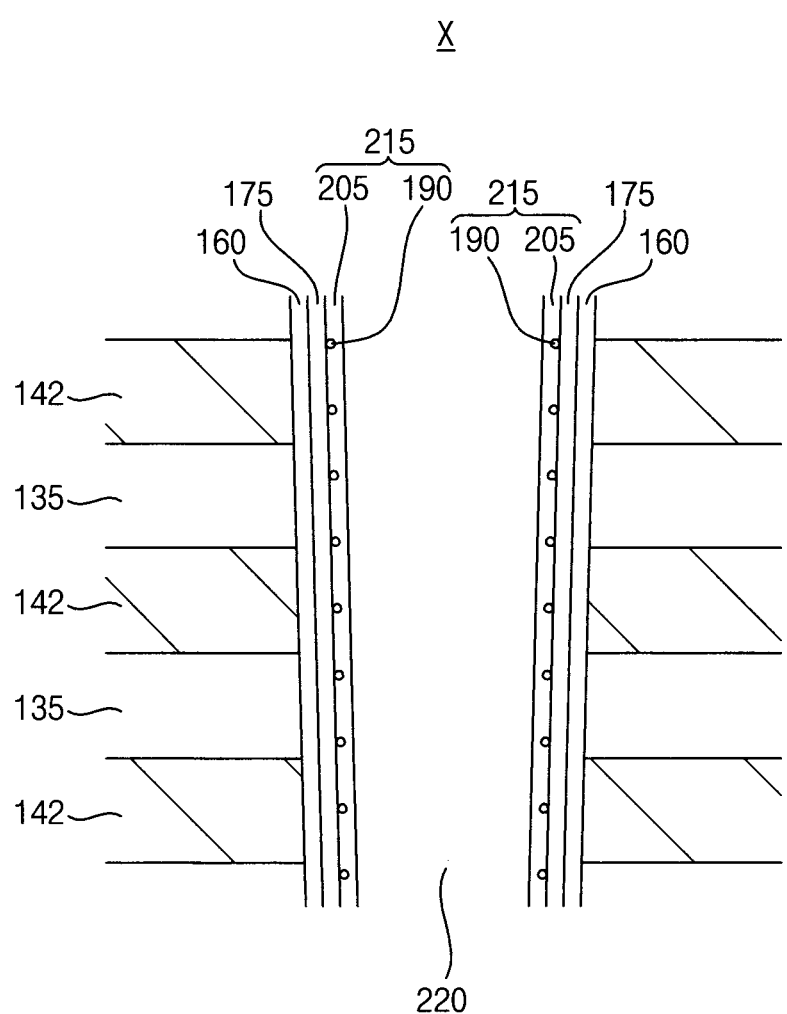

FIGS. 15 to 17 are cross-sectional views illustrating variable resistance structures of a vertical memory device in accordance with example embodiments. FIGS. 15 to 17 are enlarged cross-sectional views of a region X in FIG. 2.

Referring to FIG. 15, a portion of each of the first QDs 190 in the variable resistance structure 215 may be exposed (e.g., to an outside of the variable resistance structure 215).

For example, a portion of the first QDs 190 in the second variable resistance pattern 205 may be exposed at a surface of the second variable resistance pattern 205, and thus the first QDs 190 may contact a surface of the filling pattern 220.

Referring to FIG. 16, the variable resistance structure 215 may further include a third variable resistance pattern 207 in addition to the first and second variable resistance patterns 185 and 205, and a second QDs 195 may be formed in the third variable resistance pattern 207.

Thus, the variable resistance structure 215 may include first to third variable resistance patterns 185, 205 and 207 sequentially arranged, and the first and second QDs 190 and 195 may be formed in the second and third variable resistance patterns 205 and 207, respectively. The third variable resistance pattern 207 may include a material substantially the same as that of the first and second variable resistance patterns 185 and 205. A plurality of second QDs 195 may be formed to be spaced apart from each other in the first direction, or some of the second QDs 195 may contact each other.

Referring to FIG. 17, the variable resistance structure 215 may include only the second variable resistance pattern 205 having the first QDs 190 therein. In this case, the first QDs 190 may contact a surface of the channel 175.

Figure 18:
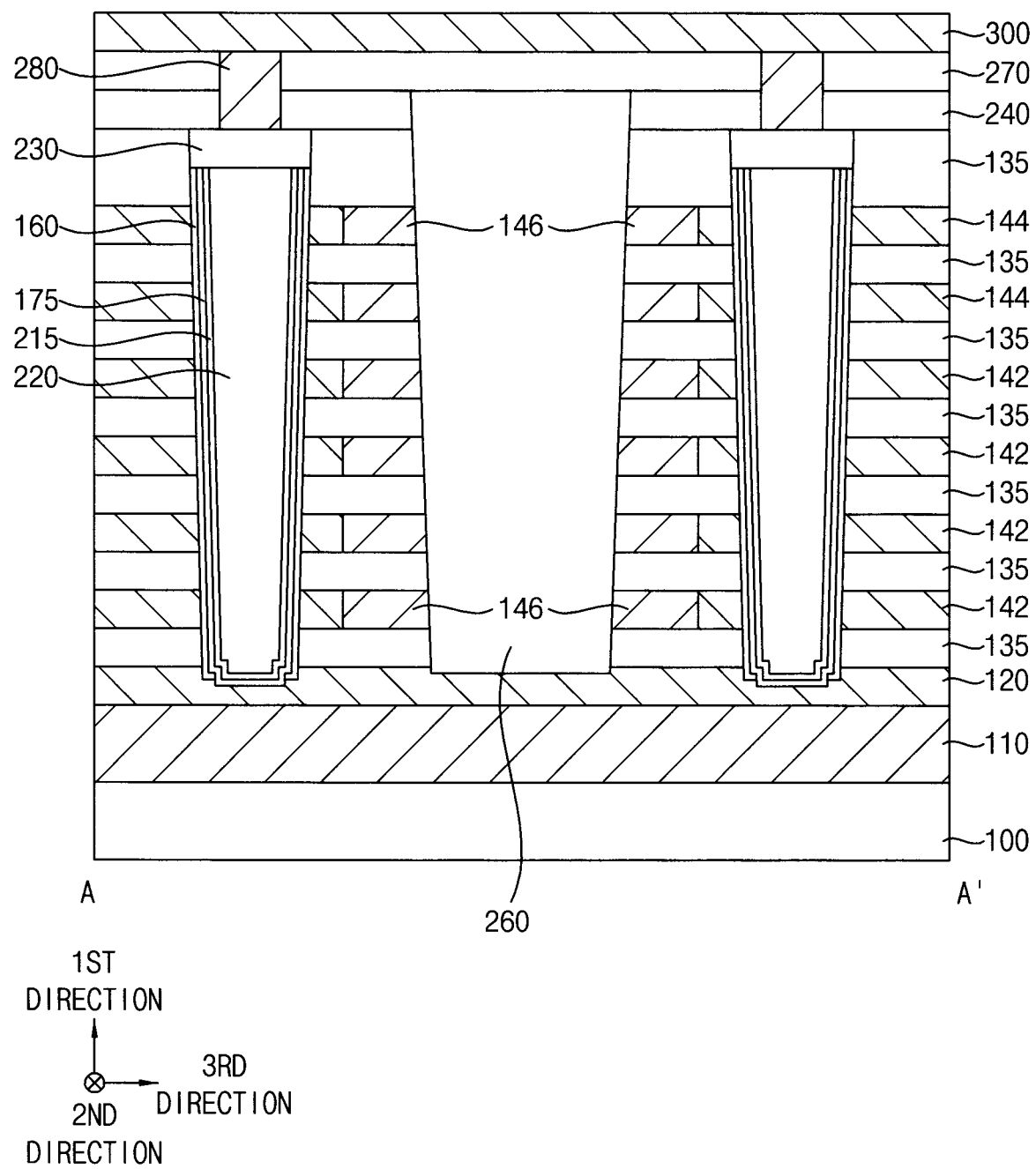
FIG. 18 is a cross-sectional view illustrating a vertical memory device in accordance with example embodiments.

FIG. 18 is a cross-sectional view illustrating a vertical memory device in accordance with example embodiments. This vertical memory device may be substantially the same as or similar to that of FIGS. 1 to 3, except for the gate electrodes. Thus, like reference numerals refer to like elements, and detailed descriptions thereon are omitted herein.

Referring to FIG. 18, the second gate electrode 144 may be formed at first and second levels from above.

Each of the second gate electrodes 144 may have a thickness substantially the same as that of each of the first gate electrodes 142.

In example embodiments, each of the first and second gate electrodes 142 and 144 may further include a metal pattern 146. For example, each of the first and second gate electrodes 142 and 144 may include a polysilicon pattern doped with n-type impurities and the metal pattern 146 that may be sequentially arranged in the third direction and may contact each other. The metal pattern 146 may be formed at a portion of each of the first and second gate electrodes 142 and 144 adjacent the opening 250 or the division layer 260.

Each of the first and second gate electrodes 142 and 144 may include the metal pattern 146 so that the total resistance thereof may decrease.

Figure 19:
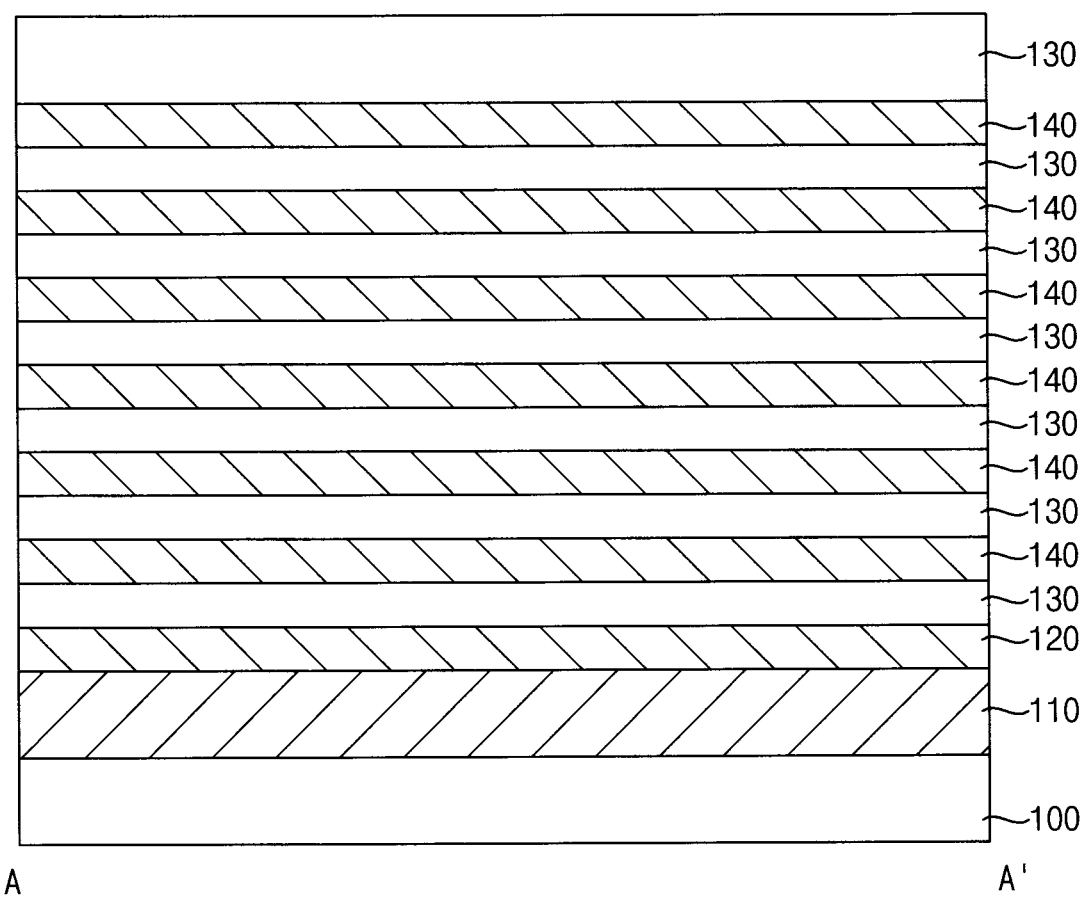
FIGS. 19 and 20 are cross-sectional views illustrating a method of manufacturing a vertical memory device in accordance with example embodiments.
Figure 20:
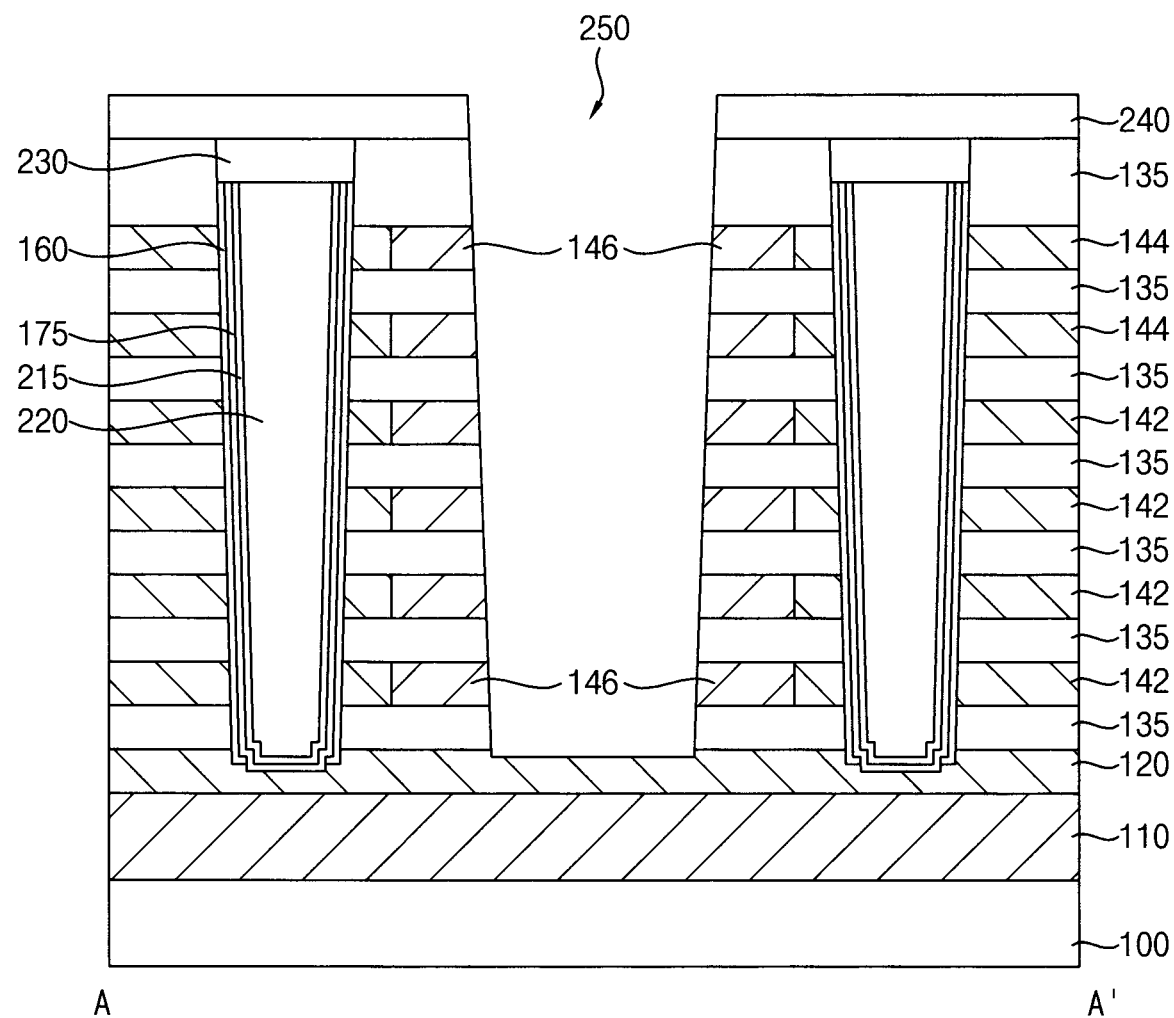

FIGS. 19 and 20 are cross-sectional views illustrating a method of manufacturing a vertical memory device in accordance with example embodiments. This method may include processes substantially the same as or similar to those illustrated with reference to FIGS. 5 to 14 and FIGS. 1 to 3, and thus detailed descriptions thereon are omitted herein.

Referring to FIG. 19, processes substantially the same as or similar to those illustrated with reference to FIG. 5 may be performed.

However, a thickness of the uppermost one of the gate electrode layer 140 may not be greater than but may be substantially equal to those of other ones of the gate electrode layers 140.

Referring to FIG. 20, processes substantially the same as or similar to those illustrated with reference to FIGS. 6 to 14 may be performed.

A portion of the gate electrode layer 140 exposed by the opening 250 may be removed to form a gap, and a metal pattern 146 may be formed to fill the gap.

In example embodiments, the formation of the gap may be performed by a wet etching process.

The metal pattern 146 may be or include a metal, e.g., tungsten, titanium, tantalum, etc.

Processes substantially the same as or similar to those illustrated with reference to FIGS. 1 to 3 may be performed to complete the fabrication of the vertical memory device.

Figure 21:
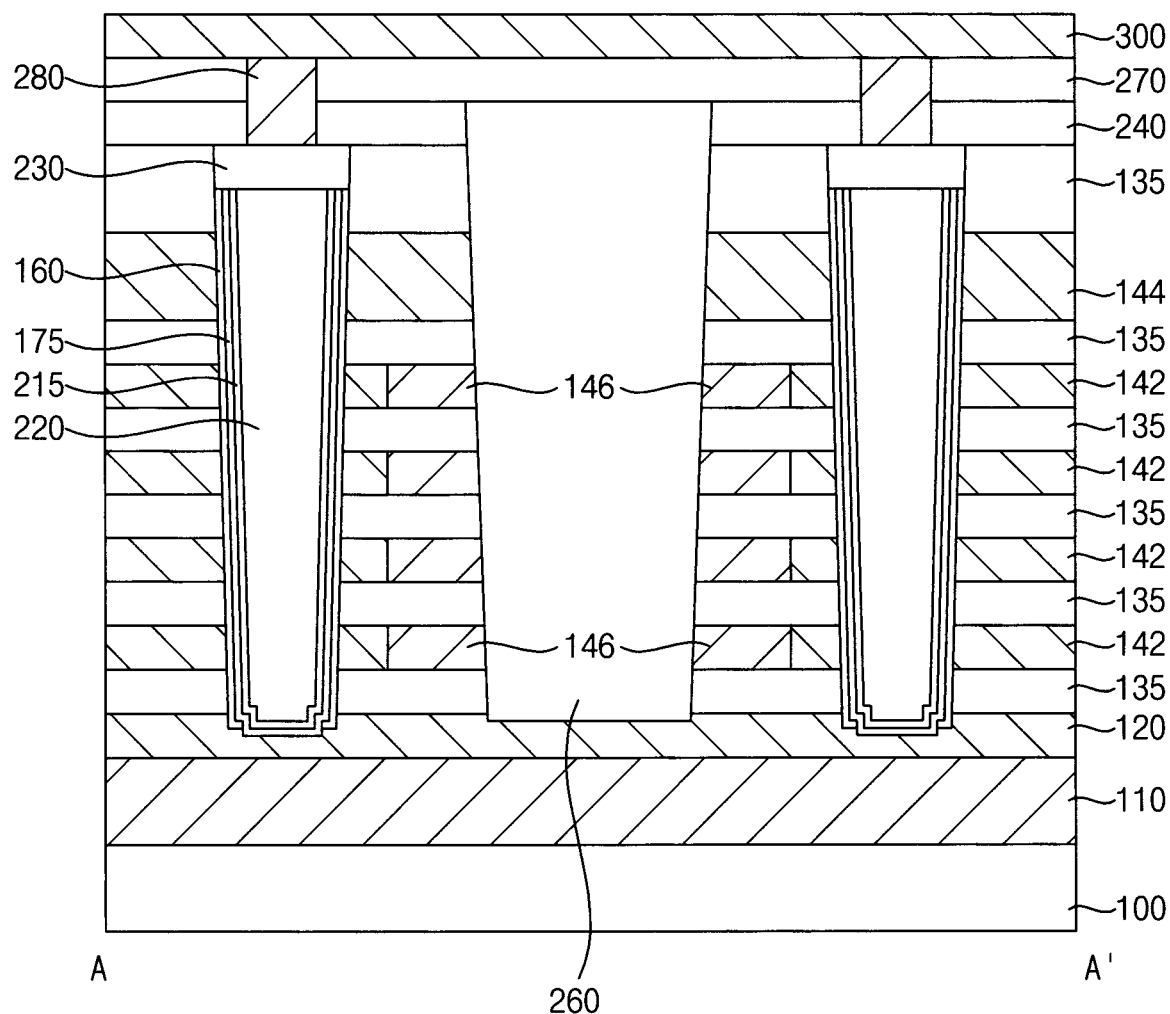
FIG. 21 is a cross-sectional view illustrating a vertical memory device in accordance with example embodiments.

FIG. 21 is a cross-sectional view illustrating a vertical memory device in accordance with example embodiments. This vertical memory device may be substantially the same as or similar to that of FIGS. 1 to 3, except for the gate electrodes. Thus, like reference numerals refer to like elements, and detailed descriptions thereon are omitted herein.

Referring to FIG. 21, the second gate electrode 144 may be formed at an uppermost level, and may have a thickness greater than that of each of the first gate electrodes 142 like that of FIGS. 1 to 3.

However, each of the first gate electrodes 142 may further include the metal pattern 146 like that of FIG. 18.

While example embodiments have been particularly shown and described, it will be understood by one of ordinary skill in the art that variations in form and detail may be made therein without departing from the spirit and scope of the claims.

Terms such as "same," "equal," "parallel," or "perpendicular," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially parallel," or "substantially perpendicular," may be exactly the same, equal, parallel, or perpendicular, or may be the same, equal, or parallel, or perpendicular within acceptable variations that may occur, for example, due to manufacturing processes.

What is claimed is:

1. A vertical memory device comprising:
   gate electrodes on a substrate, the gate electrodes being spaced apart from each other in a first direction substantially perpendicular to an upper surface of the substrate; and
   a first structure extending through the gate electrodes in the first direction and including a channel and a variable resistance structure sequentially stacked in a horizontal direction substantially parallel to the upper surface of the substrate,
   wherein the variable resistance structure includes quantum dots (QDs) therein.

2. The vertical memory device of claim 1, wherein the QDs are formed of a metal, a metal silicide, or a semiconductor material.

3. The vertical memory device of claim 2, wherein the QDs are formed of platinum, tungsten, nickel or tungsten silicide.

4. The vertical memory device of claim 2, wherein the QDs are formed of silicon, germanium, silicon-germanium, or carbon.

5. The vertical memory device of claim 1, wherein the QDs included in the variable resistance structure are arranged in the first direction with respect to each other.

6. The vertical memory device of claim 1, wherein some of the QDs of the variable resistance structure are arranged in the horizontal direction with respect to each other.

7. The vertical memory device of claim 1, wherein no QDs are exposed to an outside of the variable resistance structure.

8. The vertical memory device of claim 1, wherein some the QDs are formed at a surface of the variable resistance structure to be exposed to an outside of the variable resistance structure.

9. The vertical memory device of claim 8, wherein the QDs contact a surface of the channel.

10. The vertical memory device of claim 1, wherein the variable resistance structure is formed of a perovskite-based material, a transition metal oxide, or a chalcogenide material.

11. The vertical memory device of claim 1, wherein the variable resistance structure is a layer conformally formed directly on the channel.

12. The vertical memory device of claim 1, wherein the variable resistance structure is a single layer having no internal grain boundary.

13. The vertical memory device of claim 1, wherein the variable resistance structure includes a plurality of layers formed to be sequentially stacked in the horizontal direction.

14. The vertical memory device of claim 13, wherein the variable resistance structure includes first and second variable resistance patterns sequentially stacked in the horizontal direction from the channel such that the first variable resistance pattern is between the channel and the second variable resistance pattern, and wherein the QDs are formed in the second variable resistance pattern.

15. A vertical memory device comprising:
gate electrodes on a substrate, the gate electrodes being spaced apart from each other in a first direction substantially perpendicular to an upper surface of the substrate; and
a first structure extending through the gate electrodes in the first direction and including a channel and a variable resistance structure sequentially stacked in a horizontal direction substantially parallel to the upper surface of the substrate,
wherein the variable resistance structure includes a plurality of depletion regions spaced apart from each other in the first direction therein.

16. The vertical memory device of claim 15, wherein the variable resistance structure includes a quantum dot (QD) between the depletion regions.

17. A vertical memory device comprising:
gate electrodes on a substrate, the gate electrodes being spaced apart from each other in a first direction substantially perpendicular to an upper surface of the substrate; and
a first structure extending through the gate electrodes in the first direction and including a gate insulation pattern, a current path pattern and an information storage structure sequentially stacked in a horizontal direction substantially parallel to the upper surface of the substrate from each of the gate electrodes,
wherein the information storage structure includes quantum dots (QDs) therein, and
wherein the current path pattern includes a semiconductor material.

18. The vertical memory device of claim 17, wherein the gate insulation pattern is a gate insulation layer, the current path pattern is a current path layer, and the information storage structure is an information storage layer.

19. The vertical memory device of claim 18, wherein the information storage layer includes first and second information storage portions sequentially formed in the horizontal direction from the current path layer so that the first information storage portion is between the current path layer and the second information storage portion, and
wherein the QDs are formed in the second information storage portion.

20. The vertical memory device of claim 18, wherein the information storage layer includes first to third information storage portions sequentially formed in the horizontal direction from the current path pattern, and
wherein the QDs are formed in each of the second and third information storage portions.

* * * * *